United States Patent
Lo et al.

(10) Patent No.: US 12,272,717 B2
(45) Date of Patent: Apr. 8, 2025

(54) UNCOOLED INFRARED PHOTODETECTORS

(71) Applicant: The Regents of the University of California, Oakland, CA (US)

(72) Inventors: Yu-Hwa Lo, San Diego, CA (US); Jiayun Zhou, San Diego, CA (US); Mohammad Abu Raihan Miah, La Jolla, CA (US); Yong Zhang, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 308 days.

(21) Appl. No.: 17/780,004

(22) PCT Filed: Nov. 25, 2020

(86) PCT No.: PCT/US2020/062382
§ 371 (c)(1),
(2) Date: May 25, 2022

(87) PCT Pub. No.: WO2021/108678
PCT Pub. Date: Jun. 3, 2021

(65) Prior Publication Data
US 2023/0033475 A1    Feb. 2, 2023

Related U.S. Application Data

(60) Provisional application No. 62/941,442, filed on Nov. 27, 2019.

(51) Int. Cl.
*H01L 27/146*  (2006.01)
*H01L 31/0216*  (2014.01)
(Continued)

(52) U.S. Cl.
CPC .... *H01L 27/14649* (2013.01); *H01L 31/0216* (2013.01); *H01L 31/03762* (2013.01); *H01L 31/101* (2013.01)

(58) Field of Classification Search
None
See application file for complete search history.

(56) References Cited

U.S. PATENT DOCUMENTS 5,270,532 A    12/1993    Hietala et al.
5,288,649 A     2/1994    Keenan
(Continued)

FOREIGN PATENT DOCUMENTS

EP    2703858 A1    3/2014
WO    2018152135 A1    8/2018

OTHER PUBLICATIONS

Adhikary, S. , "A multicolor, broadband (5-20 μm), quaternary-capped InAs/GaAs quantum dot infrared photodetector", Appl. Phys. Lett. 101, 261114 (2012).
(Continued)

*Primary Examiner* — Edwin C Gunberg
(74) *Attorney, Agent, or Firm* — Perkins Coie LLP (57) ABSTRACT

Methods, apparatus and systems are described that relate to uncooled long-wave infrared (LWIR) photodetectors capable of operating at room temperature and having a simple structure that can be manufactured at low cost. One example LWIR photodetector includes a layer of amorphous silicon (a-Si) disposed on a silicon substrate and a layer of amorphous germanium (a-Ge) disposed on the a-Si layer, wherein the a-Ge layer is operable to absorb infrared light and provide photoconductive gain, and the a-Si layer is operable to produce carrier multiplication via cycling excitation process.

20 Claims, 9 Drawing Sheets

(51) Int. Cl.
  *H01L 31/0376*  (2006.01)
  *H01L 31/101*  (2006.01)

(56) References Cited

U.S. PATENT DOCUMENTS

| | | | | |
|---|---|---|---|---|
| 5,365,056 | A * | 11/1994 | Sklebitz | H04N 23/54 |
| | | | | 313/526 |
| 7,985,540 | B2 | 7/2011 | Jensen et al. | |
| 2002/0017612 | A1 | 2/2002 | Yu et al. | |
| 2003/0020018 | A1 * | 1/2003 | Hwang | H01L 31/1055 |
| | | | | 438/57 |
| 2009/0256231 | A1 * | 10/2009 | Klipstein | H01L 31/101 |
| | | | | 257/443 |
| 2012/0292622 | A1 | 11/2012 | Liu et al. | |
| 2013/0082178 | A1 | 4/2013 | Petraitis et al. | |
| 2013/0298971 | A1 | 11/2013 | Chen et al. | |
| 2014/0050244 | A1 | 2/2014 | Ohno et al. | |
| 2015/0153236 | A1 * | 6/2015 | Yagami | G01J 5/20 |
| | | | | 250/338.3 |
| 2016/0005887 | A1 | 1/2016 | Lo et al. | |
| 2019/0078208 | A1 | 3/2019 | Lee et al. | |
| 2019/0140130 | A1 * | 5/2019 | Bessonov | H01L 31/028 |

OTHER PUBLICATIONS

Boston Electronics, "Heimann Thermopiles", URL: https://www.boselec.com/wp-content/uploads/Linear/Heimann/HeimannLiterature/Heimann-Thermopiles-Mar. 29, 19.pdf, Mar. 2019.

Caniou, "Passive Infrared Detection: Theory and Applications", Springer US, 1999, Chap. 1.

Chakrabarti, "High-performance mid-infrared quantum dot infrared photodetectors", J. Phys. D: Appl. Phys. 38, 2135-2141 (2005).

Chen, "Characterizations of VO2-based uncooled microbolometer linear array", Sensor. Actuat. A-Phys. 90(3), 212-214 (2001).

Groner, "Low-Temperature Al2O3 Atomic Layer Deposition", Chemistry of Materials 2004, vol. 16, Issue 4. Jan. 30, 2004. URL: https://www.forgenano.com/wp-contenVuploads/20 12/02/2004-Groner-Low-temp-Al2O3-ALD.pdf.

Gunapala, S. D., "Long-wavelength 256/spl times/256 GaAs/AlGaAs quantum well infrared photodetector (QWIP) palm-size camera", IEEE Trans. Electron Devices 47(2), 326-332 (2000).

Hamamatsu, "InAsSb photovoltaic detectors,", URL: https://www.hamamatsu.com/resources/pdf/ssd/p13894_series_kird1133e.pdf, Oct. 2023.

ISA/US, "International Search Report and Written Opinion", for Application No. PCT/US20/62382. Mail Date: Mar. 2, 2021. 15 pages.

Kawano, Y., "Wide-band frequency-tunable terahertz and infrared detection with graphene", Nanotechnology 24, 214004 (2013).

Kim, "Room temperature far infrared (8/spl sim/10 µm) photodetectors using self-assembled InAs quantum dots with high detectivity", IEEE Electron. Device Lett. 21(7), 329-331 (2000).

Koppula, "Material response of metasurface integrated uncooled silicon germanium oxide SixGeyO1-x-y infrared microbolometers", Proc. SPIE 11002, 110021L (2019).

Lin, "Silicon nitride films deposited by atmospheric pressure chemical vapor deposition", Materials Research Society vol. 498. Dec. 4, 1998 pp. 107-112. URL: https://www.gelest.com/wp-content/uploads/technical_library/Siicon_Nitride_Films.pdf.

Liu, Y.H., "Cycling excitation process: An ultra efficient and quiet signal amplification mechanism in semiconductor,", Appl. Phys. Lett. 107, 053505 (2015).

Miah, M.A.R., "A high-efficiency low-noise signal amplification mechanism for photodetectors", Proc. SPIE 10108, 101080X (2017).

Michalczewski, "Demonstration of Hot Lwir T2SLs InAs/InAsSb photodetectors grown on GaAs substrate", Infrared Physics & Technology 95, 222-226 (2018).

Mohseni, "Uncooled InAs-GaSb type-II infrared detectors grown on GaAs substrates for the 8-12-/spl mu/m atmospheric window", IEEE J. Quantum Electron. 35(7), 1041-1044 (1999).

Nguyen, B.M., "Type-II M structure photodiodes: an alternative material design for mid-wave to long wavelength infrared regimes", Proc. SPIE 6479, 64790S (2007).

Niaz, I.A., "Modeling Gain Mechanisms in Amorphous Silicon due to efficient carrier multiplication and trap induced junction modulation", J. Lightwave Technol. 37(19), 56-66 (2019).

Niklaus, F., "MEMS-based uncooled infrared bolometer arrays: a review", Proc. SPIE 6836, 68360D (2008).

Razeghi, M., "Band gap tunability of Type II Antimonide-based superlattices", Physics Procedia 3(2), 1207-1212 (2010).

Szmulowicz, "Temperature dependence of the figures of merit for blocked impurity band detectors", J. Appl. Phys. 63, 5583-5588 (1988).

Tauc, J., "Infrared absorption in amorphous germanium", J. Non-Cryst. Solids 4, 279-288 (1970).

VIGO, "VIGO Catalogue", URL: https://vigo.com.pl/wp-content/uploads/2017/06/VIGO-Catalogue.pdfhttps://www.photonicsolutions.co.uk/upfiles/VIGOCatalogueLG06Feb18.pdf, Feb. 2018.

Woods, "Wideband infrared trap detector based upon doped silicon photocurrent devices", Appl. Opt. 57(18), D82-D89 (2018).

Yan, L., "An amorphous silicon photodiode with 2 THz gain-bandwidth product based on cycling excitation process", Appl. Phys. Lett. 111, 101104 (2017).

Yan, L., "Single photon detector with a mesoscopic cycling excitation design of dual gain sections and a transport barrier", Opt. Lett. 44(7), 1746-1749 (2019).

Yang, H.H., "Sub-10 pW/Hz0.5 room temperature Ni nanobolometer", Appl. Phys. Lett. 108, 053106 (2016).

Yu, Y., "Plasmonically Enhanced Amorphous Silicon Photodetector With Internal Gain", IEEE Photonics Technol. Lett. 31(12), 959-962 (2019).

Zhao, Y., "Optomechanical uncooled infrared imaging system: design, microfabrication, and performance", J. Microelectromech. Syst. 11(2), 136-146 (2002).

* cited by examiner

UNCOOLED INFRARED PHOTODETECTORS

RELATED APPLICATIONS

This application is a 371 National Phase Application of International Application No. PCT/US2020/062382, filed on Nov. 25, 2020, which claims priority to the provisional application with Ser. No. 62/941,442, titled "UNCOOLED INFRARED PHOTODETECTORS," filed on Nov. 27, 2019. The entire contents of the above-noted provisional application are incorporated by reference as part of the disclosure of this document.

STATEMENT REGARDING FEDERALLY SPONSORED RESEARCH OR DEVELOPMENT

This invention was made with the U.S. government support under N00014-18-1-2486, awarded by the Office of Naval Research (ONR). The government has certain rights in the invention.

TECHNICAL FIELD

The subject matter of this patent document relates generally to photodetector technology, and in particular to infrared photodetector technology.

BACKGROUND

An infrared photodetector is a detector that reacts to infrared (IR) radiation. An IR photodetector can employ a number of physical principles and materials in its operation. For example, an IR photodetector can use semiconductor materials with narrow band gaps. IR photons can cause electronic excitations in a material of an IR photodetector. For example, photovoltaic IR photodetectors include a p-n junction which can convert photons into photoelectric current. As another example, in photoconductive IR photodetectors, the resistivity of the detector element changes under the influence of the incident IR radiation. Also, a number of temperature-dependent characteristics of different materials and structures can be used to follow thermal effects of the incident IR radiation. For example, bolometers and microbolometers follow changes in resistance of a martial or a structure under the influence of IR radiation. Thermocouples and thermopiles in some photodetectors use the thermoelectric effect of IR radiation in their operation. For example, some photodetectors employ Golay cells that follow thermal expansion of a material or a structure. Many of the above-mentioned types of IR photodetectors have a complex structure and/or require a complex or expensive method for their fabrication. Accordingly, there is still a need to have IR photodetectors with a simple structure that are easy and inexpensive to fabricate.

SUMMARY OF CERTAIN EMBODIMENTS

The techniques disclosed herein can be implemented in various embodiments to achieve an uncooled long-wave infrared (LWIR) photodetector capable of operating at room temperature, having a simple structure and an inexpensive method of its manufacture.

One aspect of the disclosed technology relates to an infrared photodetector that includes a substrate. The photodetector also includes a mesa disposed on the substrate, the mesa comprising a layer of amorphous silicon disposed on a section of the substrate and a layer of long wave infrared radiation (LWIR) absorbing material disposed on the layer of amorphous silicon. Furthermore, the photodetector includes one or more passivation layers disposed on at least a part of sidewall of the mesa. The layer of LWIR absorbing material of the photodetector is operable to absorb infrared light in a range of wavelengths between 8 μm and 12 μm and produce a photocurrent, and the layer of amorphous silicon of the photodetector is operable to produce a carrier multiplication to amplify the photocurrent.

Another aspect of the disclosed technology relates to an uncooled long-wave infrared (LWIR) photodetector that includes a first amorphous semiconductor material layer and a second amorphous semiconductor material layer in contact with the first amorphous semiconductor material layer. The first amorphous semiconductor material layer of the photodetector is configured to absorb infrared light and produce a photocurrent, and the second amorphous semiconductor material layer of the photodetector is configured to produce a carrier multiplication.

Yet another aspect of the disclosed technology relates to a method of manufacturing an infrared photodetector. The method includes forming a multilayer structure. The forming can include depositing a layer of amorphous silicon (a-Si) on at least a section of a substrate and depositing a layer of long wave infrared radiation (LWIR) absorbing material next to the amorphous silicon. Alternatively, the forming can include depositing a layer of long wave infrared radiation (LWIR) absorbing material on at least a section of a substrate and depositing a layer of amorphous silicon (a-Si) next to the LWIR absorbing material. The method also includes depositing one or more passivation layers on at least a part of sidewall of the multilayer structure. Furthermore, the method includes forming a first electrode in contact with one of: the layer of LWIR absorbing material, or the a-Si layer. Also, the method includes forming a first contact pad in contact with the first electrode.

DETAILED DESCRIPTION

The techniques disclosed herein overcome the shortcomings of prior systems and can be implemented in various embodiments to provide an uncooled long-wave infrared (e.g., light having wavelengths between 8 μm and 12 μm) photodetector capable of operating at room temperature, having a simple structure, and an inexpensive method of its manufacture. Example embodiments of long-wave infrared (LWIR) photodetectors according to the technology disclosed in this patent document can use a combined structure of amorphous Ge (a-Ge) and amorphous silicon (a-Si), wherein both a-Ge and a-Si can be undoped. Also disclosed are the methods of fabrication of these LWIR photodetectors.

The disclosed detector designs and methods of fabrication can allow production of an LWIR photodetector device which has a very simple structure, is easy and low cost to fabricate, and which can operate under room temperature showing high responsivity (e.g., 1.7 A/W), high detectivity (e.g., $6\times10^8$ Jones), low noise equivalent power (e.g., 5 pW/√Hz), and high frequency response of greater than 20 kHz.

In some embodiments, a long-wave infrared photodetector includes double layers of 100 nm amorphous germanium (a-Ge) and 25 nm amorphous silicon (a-Si) and exhibits the following performance characteristics under room temperature conditions: responsivity of 1.7 A/W, detectivity of $6\times10^8$ Jones, and noise equivalent power (NEP) of 5 pW/√Hz under 5V bias and at 20 kHz operation. Above 100 Hz or beyond the bandwidth of thermal response, the device can operate as a quantum detector having the photoelectrons produced by optical excitation from the bandtail states to the mobile states of a-Ge. The superior device performance may be attributed to the combination of two amplification mechanisms: photoconductive gain in a-Ge and cycling excitation process (CEP) in a-Si, with the latter being the dominant factor. Besides its attractive performance, the device has a simple structure and is easy to fabricate at low cost, thus holding promise for night vision, sensing, autonomous driving, and many other applications.

Long-wave infrared detection has been widely used in a large number of systems including night vision, thermal sensing, remote sensing, autonomous driving, robotics vision, machine vision, disease detection, and scientific research. Over the past few decades, a large number of LWIR detectors have been demonstrated, including microbolometer, HgCdTe (Mercury Cadmium Telluride, MCT), multi-quantum well (MQWIP) or quantum dots (QDIP), Type-II superlattice structure (T2SL), blocked impurity band (BIB) trap detectors, and graphene detectors. According to the operation environment, LWIR detectors can be divided into two groups, uncooled detectors and cooled detectors. The former are mostly bolometers that detect IR induced temperature change and the output signal of a bolometer can be represented via different transduction mechanisms. Even though microbolometers have demonstrated room temperature detectivity of $10^9$ Jones, they generally have limited bandwidth that is less than 100 Hz. As a quantum detector, Type-II superlattice (T2SL) structure has shown uncooled, broad IR spectrum detection ranging from short-wave infrared (SWIR) to very-long wavelength infrared (VLWIR) light. The highest reported T2SL LWIR detectivity is about $6\times10^8$ Jones with an optical immersion design.

In contrast with uncooled LWIR detectors, almost all cooled LWIR detectors are quantum detectors with their photoresponse generated by photoexcited electrons or electron-hole pairs and having photocurrent as the output signal. At cryogenic temperatures, cooled LWIR detectors show higher performance than uncooled detectors in general. For example, HgCdTe detectors have shown detectivity of $10^{11}$ Jones at temperatures lower than 100 K. Multi-quantum well (MQWIP) or quantum dots infrared photodetectors (QDIP) have also achieved detectivity of $10^{11}$ Jones under ~77 K. Lastly, BIB trap LWIR detectors using shallow impurity states in highly doped Si or Ge have achieved detectivity as high as $10^{14}$ Jones, but the devices have to be operated at extremely low temperature (~10 K) or the impurity states would be thermally excited to produce unacceptably high dark current.

For most applications, it is highly desirable to have room temperature LWIR detectors that are easy to fabricate at low cost, and that can produce high detectivity, low noise equivalent power (NEP), and high frequency response much greater than 100 Hz. However, few LWIR detectors reported to date can meet all these requirements. Most micro bolometers have limited frequency response, and most quantum detectors require cooling and complicated materials or processing. HgCdTe, being one of the prevailing choices for LWIR detectors, is expensive and difficult to grow and scale. Similar concerns also apply to MQWIP, quantum dots, T2SL, and BIB detectors.

Herein, we disclose unique designs for uncooled LWIR photodetectors using a combined structure of amorphous Ge (a-Ge) and amorphous silicon (a-Si), wherein both a-Ge and a-Si can be undoped. Alternatively, any of the materials of the photodetectors according to the technology disclosed herein, including a-Ge and a-Si, can be doped using any dopant such as carbon, for example (at, e.g., 5% level). The a-Ge layer absorbs LWIR light and the a-Si layer produces carrier multiplication via, for example, cycling excitation process (CEP). The cycling excitation process is described in the U.S. Patent Application Publication No. US2016/0005887A1 as well as in the International Patent Application Publication No. WO2018/152135A1 both of which are incorporated herein by reference in their entirety as part of the disclosure of this patent document.

Figure 1:
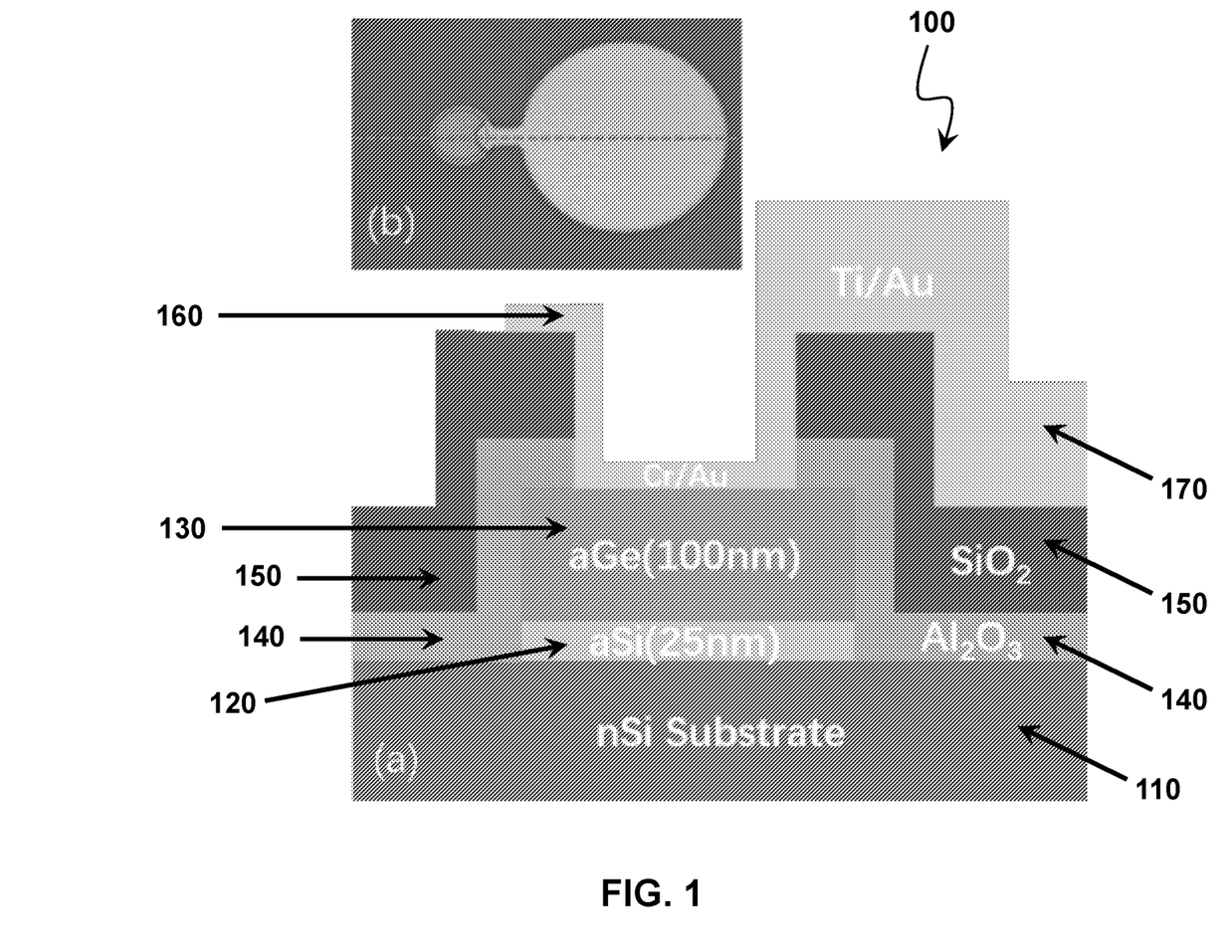
FIG. 1 shows a diagram illustrating an example embodiment of an uncooled long-wave infrared (LWIR) photodetector device.

FIG. 1 shows a diagram illustrating a cross-sectional view (not to scale) of an example embodiment of an uncooled LWIR photodetector device in accordance with the technology disclosed in this patent document (panel (a)), as well as a top-view image of an example implementation of an LWIR photodetector (panel (b)). The features of the example device illustrated in FIG. 1 are described below, including an example method of its fabrication.

An example method of fabrication of the uncooled long infrared wavelength photodetector device shown in FIG. 1 includes deposition of an amorphous Silicon layer 120 on a highly n-doped substrate 110. For example, a 25 nm thick a-Si layer can be deposited at 270° C. by plasma-enhanced chemical vapor deposition (PECVD) on a highly n-doped silicon substrate, followed by room temperature sputtering of an a-Ge layer 130, e.g., 100 nm thick, as the absorption medium. In some example embodiments of a method of fabrication of an uncooled LWIR photodetector device according to the technology disclosed in this patent document, the sequence of the deposition of an absorption medium (e.g., an LWIR absorption layer) and an a-Si layer can be reversed such that the LWIR absorption layer is deposited on a section of a substrate first followed by deposition of the a-Si layer (e.g., on at least a part of the LWIR absorption layer). After the a-Si and a-Ge deposition, 30 μm diameter device mesas are photolithographically defined and dry etched with $SF_6:C_4F_8$. To passivate the mesa sidewall, an $Al_2O_3$ layer 140 (e.g., 40 nm thick) and a $SiO_2$ layer 150 (e.g., 200 nm thick) are deposited by atomic layer deposition at 200° C. and by PECVD at 270° C., respectively. Finally, a 18 nm Cr/Au layer 160 is deposited to form the top electrode with transmission at 10.6 µm wavelength light about 10%, and a 220 nm Ti/Au layer 170 is further deposited to form the top and ground contact pads. In some example embodiments of an uncooled LWIR photodetector device according to the technology disclosed herein, the layer 160 and/or the layer 170 can be in contact with any of the layers 120 or 130.

Example experimental results obtained using an embodiment of the uncooled LWIR photodetector device in accordance with the technology disclosed herein are described below. The experimental results were produced using the following example equipment and methods. Dark current is measured with a Keysight B2900 source meter from 0 V to −5 V. Bias dependent photocurrent is measured by an RF spectrum analyzer, after being amplified by a transimpedance amplifier (TIA). The RF spectrum analyzer also gives rise to the noise spectrum for noise equivalent power (NEP) measurement. To measure the device response between 2 Hz and 6 kHz, we use a chopper to modulate a $CO_2$ laser (10.6 µm wavelength) operated at 100% duty cycle. To characterize the detector response at higher frequency than 6 kHz, we modulate the $CO_2$ laser output at 5 kHz and characterize the output power at higher (up to the 4th) harmonic frequencies as the input optical power. Using this approach, we are able to extend the range of measurement to 20 kHz. The laser spot on the device surface is 5×5 mm$^2$, producing an optical power density of 4 mW/cm$^2$. The incident light power is calibrated with a commercial detector (Thorlabs: S401C). All measurements are performed at room temperature. From the measured photocurrent at 1 Hz resolution bandwidth from an RF spectrum analyzer, we calculate frequency-dependent responsivity ($R = I_{photo}/P_{optical}$), shot noise limited specific detectivity ($D^* = R/\sqrt{(2eJ)}$), and noise equivalent power ($NEP = \sqrt{A}/D^*$) under different bias voltage. In these expressions, A is the device area, e is the magnitude of electron charge, $P_{optical}$ is the $CO_2$ laser power incident on the device area, and J is the sum of the photocurrent and dark current.

Figure 2:
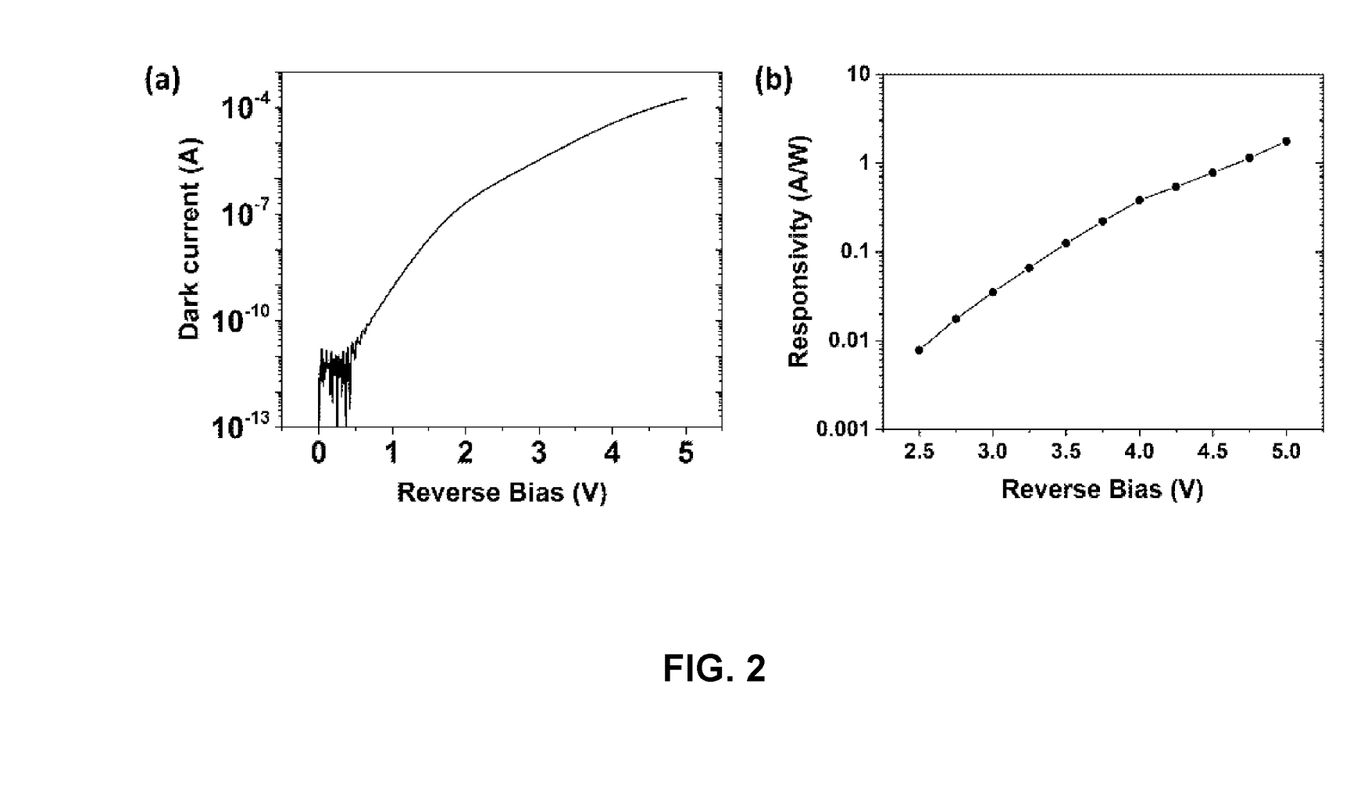
FIG. 2 shows data plots depicting DC dark current and responsivity for an example embodiment of an uncooled LWIR photodetector device.

The device photo-response for an example embodiment of the uncooled LWIR photodetector device according to the technology disclosed in this patent document was measured under 27 nW $CO_2$ laser power modulated at different frequencies (DC to 20 kHz) and under different bias voltage. The bias dependent DC dark current and responsivity at 5 kHz are shown in FIG. 2, panels (a) and (b), respectively. We plot the responsivity between 2.5V and 5V bias here because, lower than 2.5V bias, the responsivity is too low to be measured reliably. Both the dark current and photo responsivity increase with the bias voltage.

Using the measured responsivity, we can calculate the specific detectivity (D*) because above 2.5V, the dark current and the RF spectrum of the device show the dominant noise of the device is shot noise. The example results are shown in FIG. 3.

Figure 3:
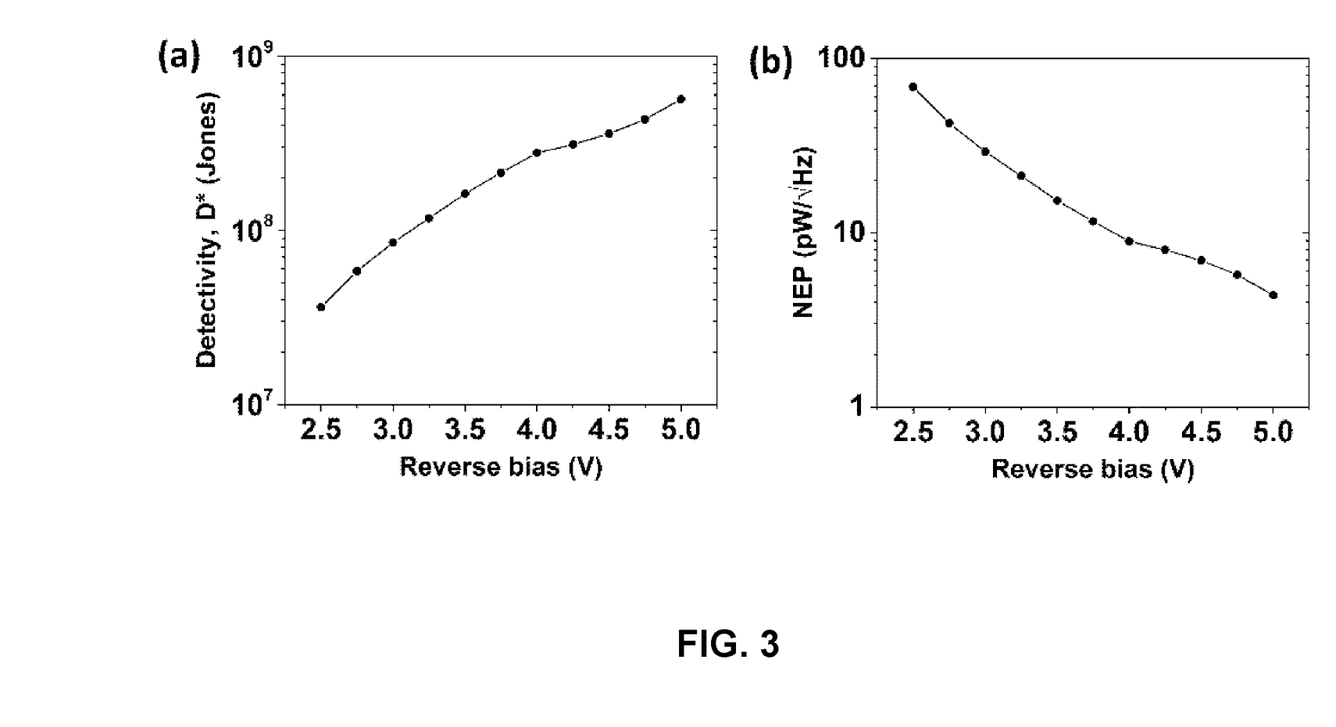
FIG. 3 shows data plots depicting detectivity and noise equivalent power (NEP) for another example embodiment of an uncooled LWIR photodetector device.

FIG. 3 shows data plots depicting bias dependent detectivity (panel (a)) and bias dependent noise equivalent power (NEP) at 5 kHz (panel (b)) for an example embodiment of the uncooled long infrared wavelength photodetector device according to the technology disclosed herein. We observe the highest specific detectivity of 6×10$^8$ Jones and the lowest NEP of 5 pW/√Hz at 5 V reverse bias with a 30 µm diameter device at 10.6 µm wavelength. Unlike bolometers or thermopiles that measure thermal effects and have limited (usually <100 Hz) frequency response, our device can produce high detectivity and low NEP at 20 kHz frequency.

Figure 4:
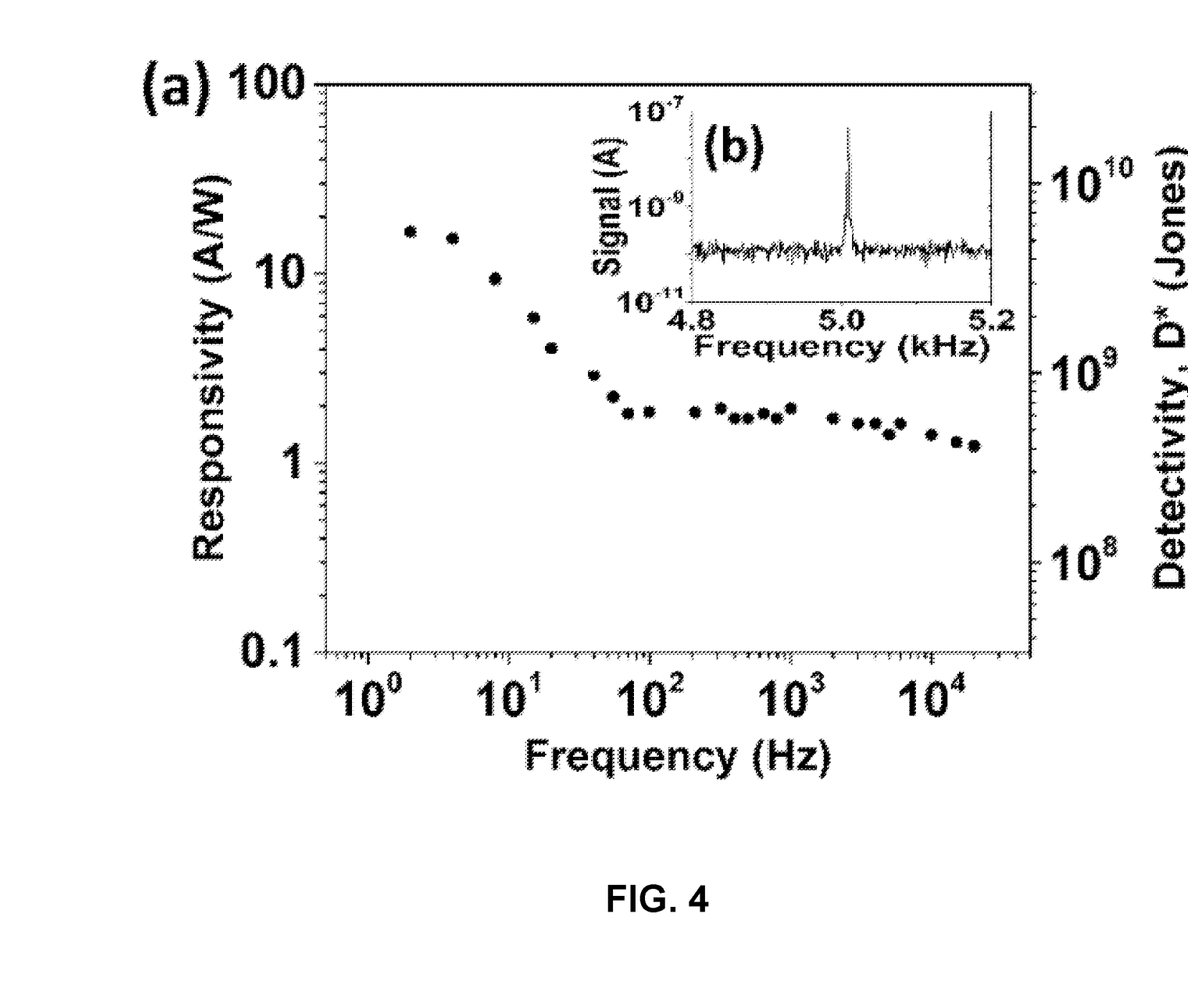
FIG. 4 shows a data plot depicting frequency dependent responsivity and detectivity for yet another example embodiment of an uncooled LWIR photodetector device.

FIG. 4 shows a data plot (a) depicting frequency dependent responsivity and detectivity of an example embodiment of the uncooled LWIR photodetector device under 5V reverse bias, with an inset plot (b) showing a photocurrent trace from RF Spectrum Analyzer at 5 kHz laser modulation. The data plot (a) in FIG. 4 shows the frequency dependence of device characteristics from 2 Hz to 20 kHz. From the example data shown in FIG. 4, we clearly observe that the example device characteristics are divided into two regimes according to frequency. At 10 Hz or lower frequency, the device responsivity and detectivity reach 10 A/W and 7×10$^9$ Jones, which by themselves set a record value for uncooled LWIR detectors, but the numbers drop rapidly above 10 Hz, showing the general property of thermal detectors. As a thermal detector, different materials of the device absorb the $CO_2$ laser power, causing temperature rise which subsequently increase dark current that is revealed as "photoresponse". Also, the higher frequency response of the detector exhibits an important aspect. For example, at higher than 100 Hz and up to 20 kHz, the maximum frequency we have measured, the device shows a photo responsivity of around 1.7 A/W and detectivity of 6×10$^8$ Jones, and the values are nearly independent of frequency within measurement errors. The results indicate that above 100 Hz, thermal effects vanish because of their slow response, and the device operates under a different mechanism which is described in detail below.

Table 1 shows a comparison of an example embodiment of the uncooled LWIR photodetector device according to the technology disclosed in this patent document with other LWIR detectors that operate under room temperature. For example, compared to other, conventional detectors, the disclosed device has shown highly favorable performance in many key metrics. Compared with thermal detectors, the disclosed device has demonstrated much higher speed. Compared with quantum detectors, the disclosed detectors offer the best room temperature performance and are the easiest to fabricate with low cost materials such as a-Ge and a-Si.

TABLE 1

Comparison of NEP (pW/√Hz) and specific detectivity, D* (×10$^8$ Jones) for different uncooled LWIR detectors

| Technology | γ (µm) | NEP | D* |
|---|---|---|---|
| Quantum Detectors | | | |
| aGe/CEP (Example Embodiment of the Disclosed Technology) | 10.6 | 5 | 6 |
| InAs QDIP | 9 | N/A | 6 |
| MCT PC optically immersed | 9-10.6 | >50$^a$ | 5-1 |
| MCT PVM optically immersed | 8-10.6 | >167$^a$ | 6-2 |
| InAsSb PV | 8-11 | 1600-16000 | 0.6-0.06 |
| T2SLs InAs/InAsSb on GaAs | 10.6 | 161 | 5 |
| Type-II PC on GaAs | 8-12 | 1500$^a$ | 1.3 |
| Thermal Detectors (Frequency limited to 100 Hz) | | | |
| VO$_2$ based Micro Bolometer | 8-12 | N/A | 1.9 |
| Si$_x$Ge$_y$O$_{1-x-y}$ Micro Bolometer | 8-12 | N/A | 11.9 |
| Ni nano bolometer | >10 | 8.7 | 0.15$^a$ |
| Thermopile Sensor | 8-13 | N/A | 2.9 |

$^a$Calculated using reported detectivity or NEP and active device area

The frequency dependent characteristics suggest that a LWIR photodetector according to the disclosed technology operates as a quantum detector (e.g., signal produced by photoexcited electrons or electron-hole pairs by absorption of LWIR photons) rather than a thermal detector at frequencies higher than 100 Hz. A physical model presented below describes possible quantum transition(s) in the long wavelength range of IR radiation (e.g., 8-12 μm) in an example embodiment of the LWIR photodetector device, as well as signal amplification mechanism(s) that can take place to give the device its superior performance. Carrier transport equations are used to analyze an optical excitation pathway and a signal amplification mechanism for the example embodiment of the LWIR photodetector device.

To obtain information to help develop the physical model, we have measured the photoresponse of two test structures on a n-Si substrate, one with a 100 nm a-Ge layer (or film) and another with a 25 nm a-Si layer. The test structure with the 100 nm a-Ge layer produced responsivity of 0.01 A/W at 5 kHz under 0.5 V bias. On the other hand, the test structure with the 25 nm a-Si layer showed very low LWIR responsivity (on the order of $10^{-4}$ A/W). This example result indicates that it is the a-Ge layer that contributes to the primary photocurrent. The purpose of the a-Si layer is to amplify the primary photocurrent via the CEP mechanism, which is an intrinsic process that results in carrier multiplication.

The above measurements indicate that the main operation mechanism under high (e.g., >100 Hz) frequency is due to photoexcitation of electrons from the bandtail states to the mobile states of the conduction band of a-Ge. The excited electrons in the mobile states have much greater mobility than those in the bandtail states and can cross the a-Ge/a-Si heterointerface to enter the a-Si layer where a high electric field exists under a voltage bias. The a-Si layer provides efficient carrier multiplication via the cycling excitation process (CEP), producing high responsivity.

Figure 5:
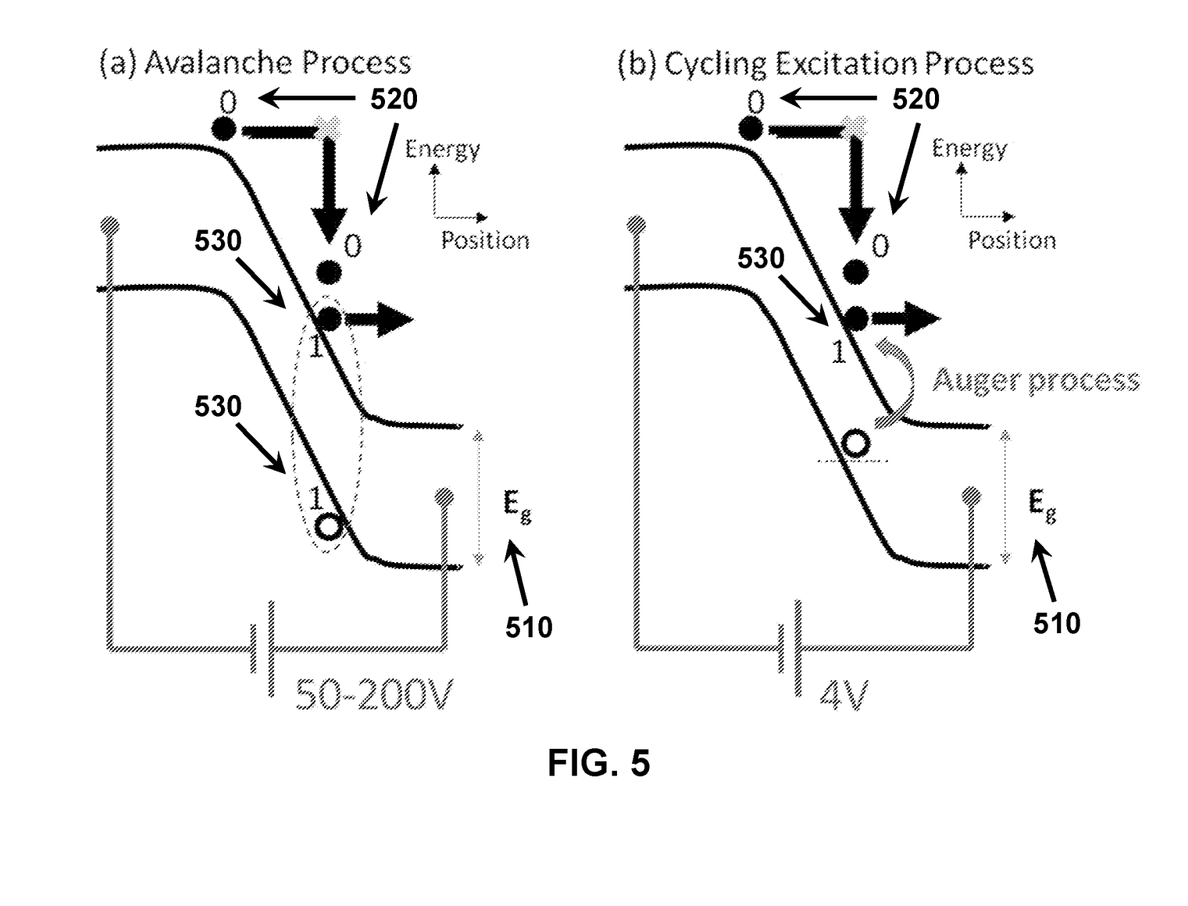
FIG. 5 shows a schematic illustration of an avalanche process and a cycling excitation process (CEP).

An internal amplification mechanism (i.e., impact ionization) has been used in photodetection for decades. In an avalanche photodiode, APD, a reverse-biased p-n junction device that is operated at a voltage close to breakdown voltage, an ionization collision with the lattice occurs when the photogenerated primary carriers acquire enough energy, as shown in FIG. 5, panel (a). Secondary electron-hole (e-h) pairs are produced from this collision, which in turn cause additional ionization collisions as the pairs cross the depletion region (i.e., the "avalanche" process). APD-based photoreceivers achieve sufficient sensitivity for fiber-optic communications. However, they require a high operation voltage (e.g., over 20 V) and suffer from high excess noise with increasing gain.

FIG. 5 shows a schematic illustration of the avalanche process (panel (a)) and the cycling excitation process (panel (b)). One example for the avalanche process is based on impact ionization through Coulomb interactions between the hot electrons in the conduction band and the electrons in the valence band. In contrast, the cycling excitation process occurs, for example, as a result of the Auger process between hot electrons in the conduction band and electrons in the localized states in the tail of the valence band. In FIG. 5, element 510, "$E_g$", represents energy bandgap, element 520, "0", represents a primary carrier from direct photo absorption, and element 530, "1", represents a carrier produced by Auger excitation.

In contrast to the "avalanche" process in an APD, the cycling excitation process (CEP) relies on the transitions involving localized states, which are formed, for example, via dopant compensation within a p-n junction diode or bandtail states in disordered materials such as amorphous silicon. The Coulomb interactions that occur between energetic carriers and these localized states have stronger efficiency since they relax the k-selection rule, thus enhancing the probability of new electron-hole (e-h) pair generation. In the Auger process, illustrated in FIG. 5, panel (b), an electron from a localized acceptor state is excited to the mobile conduction band, thereby generating a higher-energy electron. The rate of this generation can be calculated quantum mechanically using Fermi's golden rule by considering Bloch waves for free electrons and hydrogen is orbitals for localized electrons. This calculation shows that the generation rate increases with an increasing reverse bias voltage, as illustrated in FIG. 6, panel (a).

Figure 6:
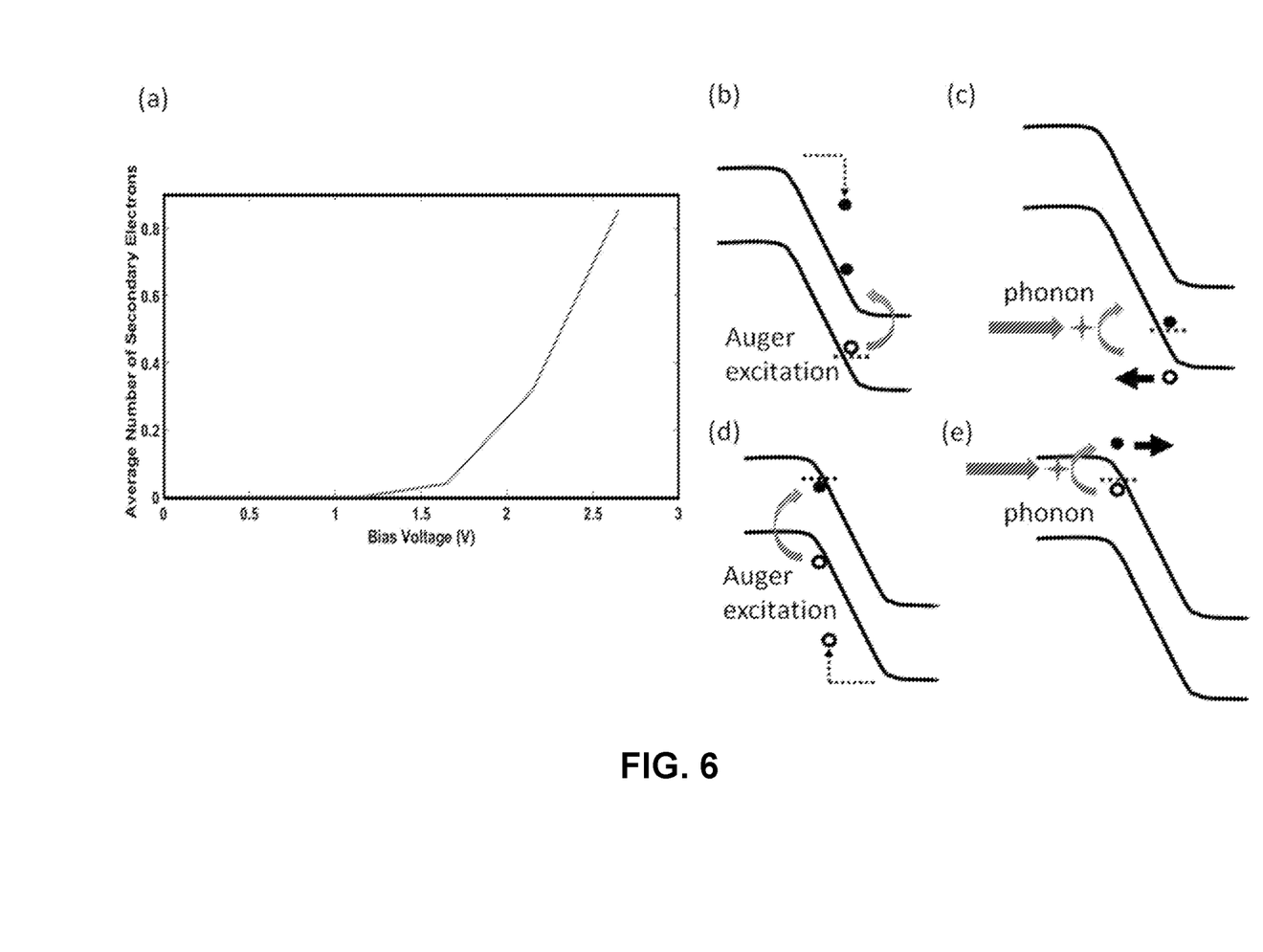
FIG. 6 illustrates details of the cycling excitation process.

FIG. 6, panel (a) shows average number of secondary electrons generated as a result of the Auger process, calculated using Fermi's golden rule. FIG. 6, panel (b) illustrates that a photogenerated electron initiates the Auger excitation. FIG. 6, panel (c) illustrates mobile hole formation via phonon absorption. FIG. 6, panel (d) shows that another Auger process occurs when the mobile hole traveling back to the junction area excites a new electron-hole pair. FIG. 6, panel (e) illustrates mobile electron formation via another phonon absorption.

Following the Auger process, the cycling process is carried out via phonon absorption (FIG. 6, panels (b) and (c)) which transfers carriers from the localized band to the mobile band. Carrier-phonon interactions act as negative feedback, making the device perform stably and quietly and leading to significantly reduced noise. The hole that is left behind in an impurity state, for example, can be filled by a valence band electron via phonon absorption. Furthermore, the hole thus created in the mobile valence band travels back to the p-n junction, and a similar Auger excitation occurs to produce another electron-hole pair from, for example, compensating donor states in the p-type region, as illustrated in FIG. 6, panels (d) and (e). These processes continue to cycle, which gives the mechanism its name. Compared with an impact ionization, utilization of the cycling excitation process in a device can enhance the device gain and efficiency, and can reduce the operation bias and excess noise for the device. Various example embodiments of the LWIR photodetector devices according to the technology disclosed in this patent document operate using low bias (e.g., reverse bias) voltages, such as, for example, bias voltages in any of the following voltage ranges (absolute voltage values are given): 0V-3.5V; 0V-5V; 0V-12V; 0V-24V; 0V-100V.

Assuming that photoexcited electrons are generated from electron transition between the bandtail states and the mobile states of conduction band of a-Ge, continuity Equations (1) and (2) for electron concentrations in the mobile states of conduction band (n) and in the conduction bandtail ($n_t$) can be written as:

$$\frac{dn}{dt} = -n\gamma_n - \frac{n - n_o}{\tau'} + n_t\gamma_t + n_t\sigma G_p \quad (1)$$

$$\frac{dn_t}{dt} = -n_t\gamma_t - n_t\sigma G_p - \frac{n_t - n_{to}}{\tau} + n\gamma_n \quad (2)$$

where $\gamma_t$ ($\gamma_n$) is the electron emission (capture) rate from (to) bandtail states to (from) the conduction band, $1/\tau$ ($1/\tau'$) is the thermal generation-recombination rate between bandtail states (conduction band) to the valence band, $\sigma$ is the interaction cross section of a bandtail state electron and LWIR photon, and $G_p$ represents the LWIR photon flux. In addition, $n_o$ and $n_{to}$ represent the equilibrium electron concentration in the mobile states of conduction band and in the conduction bandtail of a-Ge, respectively. Hence the relation $n_o\gamma_n = n_{to}\gamma_t$ holds.

To write Equations (1) and (2), it was assumed $$\frac{d}{dx}J_n \approx \frac{d}{dx}(env_d) \approx ev_d \frac{dn}{dx} \approx 0$$

where $J_n$ represents the electron current density in a-Ge and $v_d$ is the drift velocity of electrons in the mobile states. Here the current contribution by electron hopping over the localized states was ignored. $v_d$ can be expressed in terms of electron transit time $t_{tr}$ and a-Ge thickness $d_{aGe}$ as $t_{tr}=d_{aGe}/v_d$.

Figure 7:
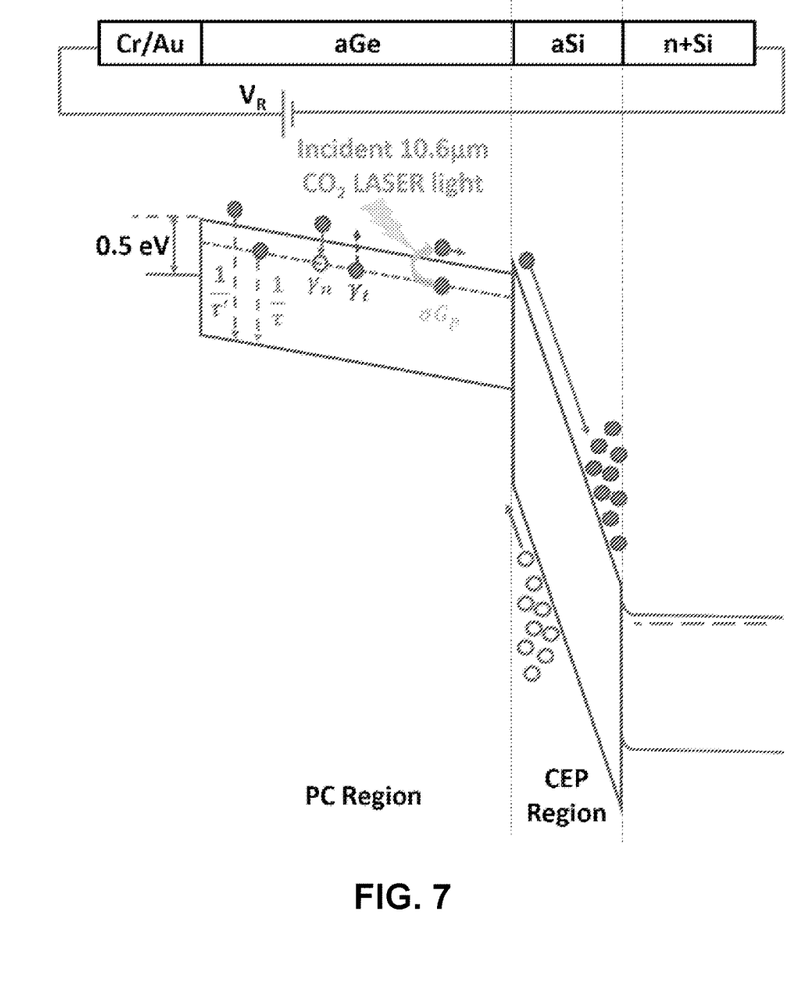
FIG. 7 shows a band diagram for an example embodiment of an uncooled LWIR photodetector device under reverse bias.

After crossing the a-Ge/a-Si interface, electrons will experience bias-dependent CEP gain in a-Si. Since the energy barrier for a-Ge/a-Si interface is small for electrons, it is assumed that electron injection efficiency from the mobile states of conduction band of a-Ge to a-Si is 100%. Ignoring the drift velocity difference between electrons and holes in the mobile states of conduction and valence band for simplicity, the total particle current density, J, can be represented as:

$$J=J_n G_{CEP}=env_d G_{CEP} \quad (3)$$

where J is the sum of the electron current density and the CEP generated hole current density, as illustrated in FIG. 7.

FIG. 7 shows a band diagram for an example embodiment of uncooled long infrared wavelength photodetector device according to the technology disclosed herein when the embodiment of the device is under reverse bias. In FIG. 7, $\tau^{-1}$ ($\tau^{-1}$) represent generation recombination rate from conduction band (bandtail) to valence band, $\gamma_n$ ($\gamma_t$) are electron capture (emission) rate to (from) bandtail state, $\sigma G_p$ is electron generation rate via photoexcitation of bandtail states by incident LWIR photon flux.

By setting the d/dt terms to be zero for DC analysis and using the relation $n_o\gamma_n=n_{to}\gamma_t$, n can be derived from Equations (1) and (2) as:

$$n = n_o\left(1 + \sigma G_p \frac{n_{to}}{n_o} t_{life}\right) \quad (4)$$

$$t_{life} = \frac{1}{\left(\gamma_n + \frac{1}{\tau'}\right) + (\gamma_t + \sigma G_p)\frac{\tau}{\tau'}} \quad (5)$$

where $t_{life}$ is the effective electron lifetime (i.e. the amount of time for an electron to stay in the mobile states of conduction band).

From Equations (3) to (5), the dark current density ($J_{dark}$), photocurrent density ($J_{photo}$), and responsivity (R) can be found as:

$$J_{dark} = en_o v_d G_{CEP} \quad (6)$$

$$J_{photo} = J - J_{dark} = e\sigma G_p n_{to} t_{life} v_d G_{CEP} \quad (7)$$

$$R = \frac{J_{photo}}{h\nu G_p} = \frac{e}{h\nu}(\sigma n_{to} d_{aGe})\left(\frac{t_{life}}{t_{tr}}\right)G_{CEP} = \frac{e}{h\nu}\eta G_{PC} G_{CEP} \quad (8)$$

To obtain Equation (8), we have used the relations $t_{tr}=d_{aGe}/v_d$ and quantum efficiency $\eta=\sigma n_{to} d_{aGe} \sim \alpha d_{aGe}$ with $\alpha$ being the LWIR light absorption coefficient for a-Ge. The measured absorption coefficient at 10.6 μm for undoped a-Ge is ~50 cm$^{-1}$. For a thin (e.g., 100 nm) layer of a-Ge, η is estimated to be on the order of 10$^{-3}$. This value may be overestimated since part of the measured light absorption is caused by photo excitation of holes from the valence band-tail states to the mobile states of valence band and those mobile holes enter the cathode directly without experiencing CEP gain.

In Equation (8), the responsivity contains two signal amplification terms, the CEP gain produced in a-Si and the photoconductive gain in a-Ge defined by $G_{PC}=t_{life}/t_{tr}$ with $t_{life}$ being the effective electron lifetime represented by Equation (5) and $t_{tr}$ the electron transit time across the a-Ge layer.

The example model, described above, shows that a LWIR photodetector device according to the technology disclosed in this patent document can operate as a "quantum detector" in which LWIR light excites electrons from the bandtail states to the mobile states of conduction band. Such excited electrons experience two gain mechanisms in series, the conventional photoconductive gain in a-Ge and the CEP gain in the high field a-Si region. The CEP gain is critical because the photoconductive gain is modest or in some case, negligible in some embodiments of the devices according to the technology disclosed herein. Due to the high density of bandtail states in a-Ge and high phonon emission rate for electrons to fall into the bandtail states from the mobile states, the effective lifetime for electrons to stay in the mobile states is in picoseconds. On the other hand, the low mobility and low E-field in a-Ge (most E-field drops in a-Si layer) produces a transit time of the order of 10 ps. As a result, the photoconductive gain $G_{PC}=t_{life}/t_{tr}$ can be modest. Some embodiments of the devices disclosed herein largely rely on the CEP gain to increase their photo responsivity and detectivity.

Figure 8:
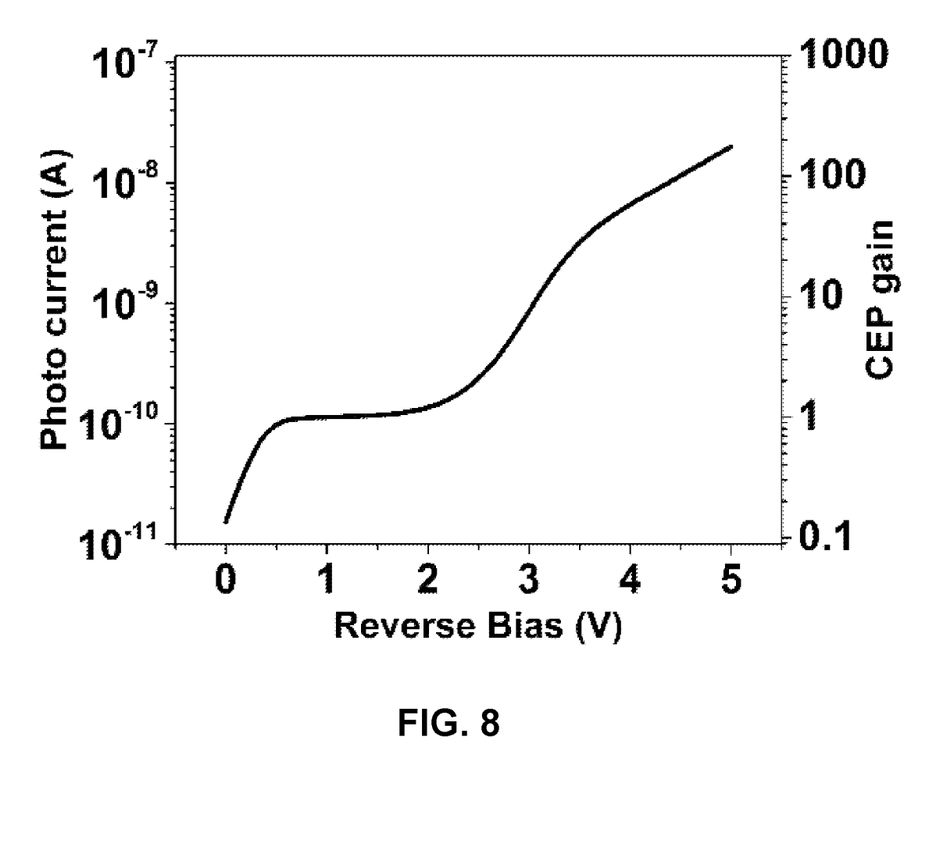
FIG. 8 shows a data plot illustrating a bias-dependent cycling excitation process gain for an example structure of an uncooled LWIR photodetector device without the amorphous Ge (a-Ge) layer.

FIG. 8 shows a data plot depicting the photoresponse (at 639 nm wavelength) of an example embodiment of LWIR photodetector device according to the technology disclosed in this patent document. The example embodiment included an a-Si layer on an n-Si substrate and did not include the a-Ge LWIR absorption layer. Such an embodiment was used for characterization of CEP gain. Data shown in FIG. 8 illustrate the bias-dependent CEP gain under visible (e.g., 639 nm) light excitation for the example embodiment of the LWIR photodetector device structure without the a-Ge layer. Multiplying the responsivity of ~10$^{-2}$ A/W for the a-Ge test structure by the CEP gain of over 100 from FIG. 8, we achieve the net responsivity of >1 A/W for the a-Si/a-Ge heterostructure device under 5V bias. This value agrees well with the measured responsivity (1.7 A/W) shown in FIG. 2 (panel (b)). The result further confirms that CEP gain plays a key role in achieving high responsivity, high detectivity, and low NEP in the uncooled LWIR photodetector devices according to the disclosed technology.

In some embodiments, an uncooled long infrared wavelength photodetector device according to the technology disclosed herein uses a-Ge for light absorption and an a-Si layer to produce CEP gain for photocurrent amplification. At 20 kHz optical modulation, for example, an example 30 μm diameter LWIR photodetector device has shown a detectivity value of 6×10$^8$ Jones, which is among the highest detectivity values for room temperature LWIR detectors. The example device shows a NEP value of 5 pW/√Hz, the lowest value for all uncooled LWIR detectors. Frequency dependent measurements show that photodetector devices according to the technology disclosed herein can operate as quantum detectors above 100 Hz, and the CEP gain is key to their superior performance. The fast response, room temperature operation, high detectivity, low NEP, and simple and low-cost fabrication process make the LWIR photodetector devices according to the technology disclosed in this patent document an attractive choice for night vision, machine vision, autonomous driving and many other applications.

Figure 9:
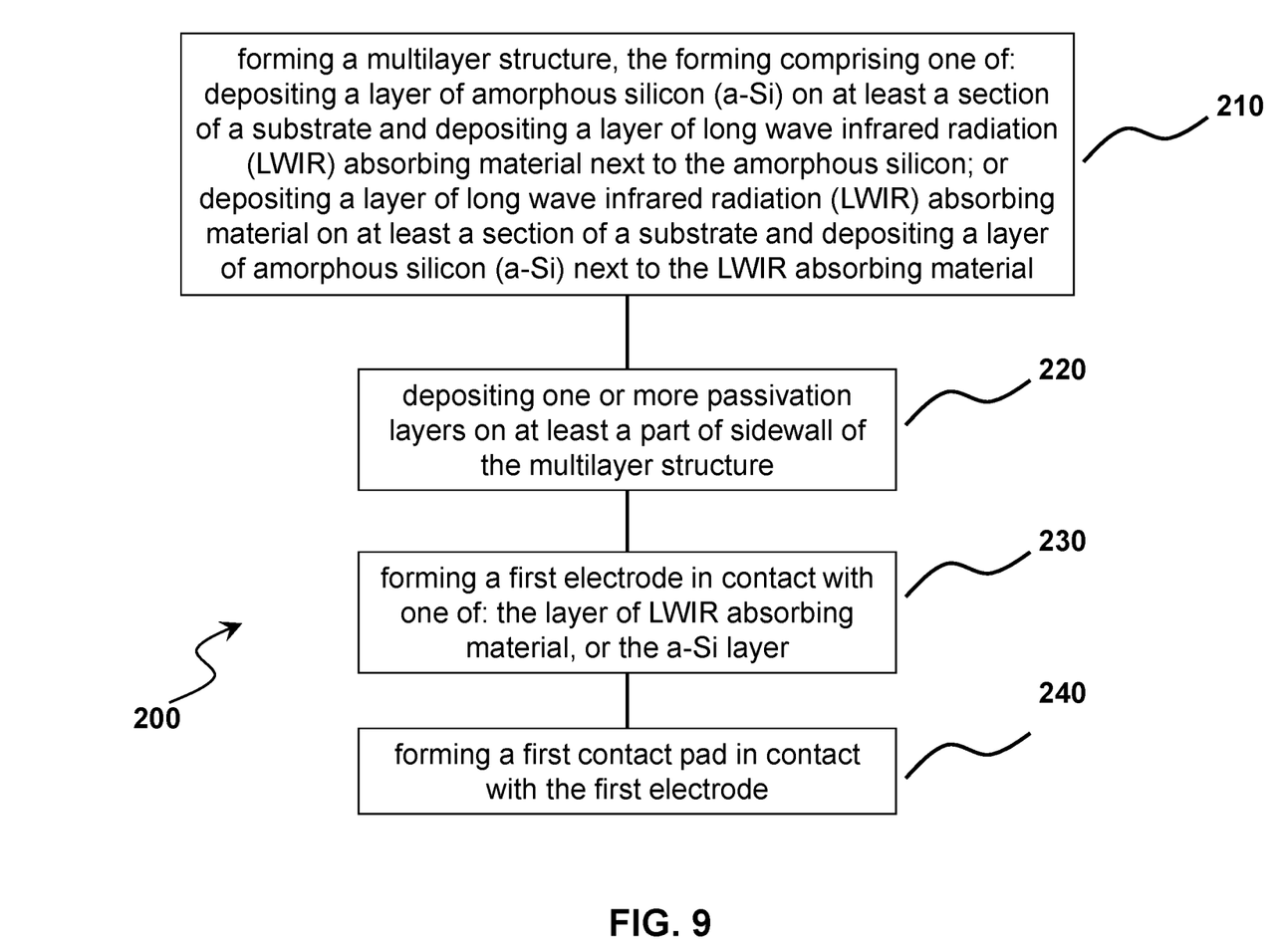
FIG. 9 illustrates a diagram of an example embodiment of a method of manufacturing an uncooled LWIR photodetector device.

FIG. 9 illustrates a diagram of an example embodiment of a method 200 of manufacturing an uncooled LWIR photodetector device according to the technology disclosed in this patent document. The method 200 includes a step 210 of forming a multilayer structure, the forming comprising one of: depositing a layer of amorphous silicon (a-Si) on at least a section of a substrate and depositing a layer of long wave infrared radiation (LWIR) absorbing material next to the amorphous silicon; or depositing a layer of long wave infrared radiation (LWIR) absorbing material on at least a section of a substrate and depositing a layer of amorphous silicon (a-Si) next to the LWIR absorbing material. The method 200 further includes a step 220 of depositing one or more passivation layers on at least a part of sidewall of the multilayer structure. The method 200 also includes a step 230 of forming a first electrode in contact with one of: the layer of LWIR absorbing material, or the a-Si layer. Furthermore, the method 200 includes a step 240 of forming a first contact pad in contact with the first electrode.

One aspect of the disclosed technology relates to an infrared photodetector that includes a substrate; a mesa disposed on the substrate, the mesa comprising: a layer of amorphous silicon disposed on a section of the substrate and a layer of long wave infrared radiation (LWIR) absorbing material disposed on the layer of amorphous silicon; one or more passivation layers disposed on at least a part of sidewall of the mesa, wherein: the layer of LWIR absorbing material is operable to absorb infrared light in a range of wavelengths between 8 µm and 12 µm and produce a photocurrent, and the layer of amorphous silicon is operable to produce a carrier multiplication to amplify the photocurrent.

In some example embodiments of the infrared photodetector, the substrate includes at least one of: a silicon, an indium tin oxide, a glass, a ceramic, a semiconductor, or a metal. In other example embodiments of the infrared photodetector, the layer of amorphous silicon is undoped. According to certain example embodiments of the infrared photodetector, the layer of amorphous silicon is doped using a dopant. In an example embodiment of the infrared photodetector, the dopant is carbon. In yet another example embodiment of the infrared photodetector, the long wave infrared radiation (LWIR) absorbing material is one of: an amorphous germanium, a graphene, an amorphous GeSn, or a mercury cadmium telluride. In some example embodiments of the infrared photodetector, the layer of amorphous silicon is operable to produce the carrier multiplication via cycling excitation process. In other example embodiments of the infrared photodetector, the one or more passivation layers include a first layer of $Al_2O_3$ and a second layer of $SiO_2$ disposed on at least a part of the layer of $Al_2O_3$. According to some example embodiments, the infrared photodetector includes a first electrode disposed on the layer of LWIR absorbing material, a first contact pad configured to be in electric contact with the first electrode, and a second contact pad, wherein the first and the second contact pads are configured to receive an electric voltage to establish a difference of electrical potentials between the first and the second contact pads. In an example embodiment of the infrared photodetector, an absolute value of the difference of electrical potentials is between 0 V and 100 V. In another example embodiment of the infrared photodetector, the first electrode includes chromium and gold. In yet another example embodiment of the infrared photodetector, the first contact pad includes titanium and gold. According to some example embodiments of the infrared photodetector, the first electrode provides at least 0.1% transmission through the first electrode for light with 10.6 µm wavelength. In other example embodiments of the infrared photodetector, a thickness of the layer of amorphous silicon is between 10 nm and 50 nm. In yet other example embodiments of the infrared photodetector, a thickness of the layer of LWIR absorbing material is between 50 nm and 200 nm. In some example embodiments of the infrared photodetector, a width of the mesa is between 10 µm and 1000 µm. In other example embodiments of the infrared photodetector, a thickness of the first electrode is between 5 nm and 100 nm. According to some example embodiments of the infrared photodetector, the photodetector is operable at room temperatures.

Another aspect of the disclosed technology relates to an uncooled long-wave infrared (LWIR) photodetector that includes a first amorphous semiconductor material layer and a second amorphous semiconductor material layer in contact with the first amorphous semiconductor material layer, wherein the first amorphous semiconductor material layer is configured to absorb infrared light and produce a photocurrent, and the second amorphous semiconductor material layer is configured to produce a carrier multiplication.

Yet another aspect of the disclosed technology relates to a method of manufacturing an infrared photodetector that includes: forming a multilayer structure, the forming comprising one of: depositing a layer of amorphous silicon (a-Si) on at least a section of a substrate and depositing a layer of long wave infrared radiation (LWIR) absorbing material next to the amorphous silicon, or depositing a layer of long wave infrared radiation (LWIR) absorbing material on at least a section of a substrate and depositing a layer of amorphous silicon (a-Si) next to the LWIR absorbing material; depositing one or more passivation layers on at least a part of sidewall of the multilayer structure; forming a first electrode in contact with one of: the layer of LWIR absorbing material, or the a-Si layer; and forming a first contact pad in contact with the first electrode.

In some example embodiments of the method of manufacturing, the substrate includes at least one of: a silicon, an indium tin oxide, a glass, a ceramic, a semiconductor, or a metal. In other example embodiments of the method of manufacturing, the long wave infrared radiation (LWIR) absorbing material is one of: an amorphous germanium, a graphene, an amorphous GeSn, or a mercury cadmium telluride. In yet other example embodiments of the method of manufacturing, the one or more passivation layers include a first layer of $Al_2O_3$ and a second layer of $SiO_2$ disposed on at least a part of the layer of $Al_2O_3$. According to some example embodiments of the method of manufacturing, the first electrode includes chromium and gold. According to an example embodiment of the method of manufacturing, the first contact pad includes titanium and gold. In some example embodiments of the method of manufacturing, the depositing the layer of amorphous silicon is performed by plasma-enhanced chemical vapor deposition. In other example embodiments of the method of manufacturing, the depositing the layer of amorphous silicon is performed at a temperature between 100° C. and 400° C. According to some example embodiments of the method of manufacturing, the depositing the layer of long wave infrared radiation (LWIR) absorbing material is performed using sputtering. In an example embodiment of the method of manufacturing, the depositing the layer of long wave infrared radiation (LWIR) absorbing material is performed at a temperature between 0° C. and 100° C. In yet another example embodiment of the method of manufacturing, the forming the multilayer structure is performed using photolithography and dry etching with $SF_6:C_4F_8$. In some example embodiments of the method of manufacturing, the depositing of the first layer of $Al_2O_3$ is performed using atomic layer deposition. In other example embodiments of the method of manufacturing, the depositing of the first layer of $Al_2O_3$ is performed at a temperature between 100° C. and 400° C. According to some example embodiments of the method of manufacturing, the depositing of the second layer of $SiO_2$ is performed using plasma-enhanced chemical vapor deposition. According to an example embodiment of the method of manufacturing, the depositing of the second layer of $SiO_2$ is performed at a temperature between 100° C. and 400° C.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

It is understood that the various disclosed embodiments may be implemented individually, or collectively, in devices comprised of various optical components, electronics hardware and/or software modules and components. These devices, for example, may comprise a processor, a memory unit, an interface that are communicatively connected to each other, and may range from desktop and/or laptop computers, to mobile devices and the like. The processor and/or controller can perform various disclosed operations based on execution of program code that is stored on a storage medium. The processor and/or controller can, for example, be in communication with at least one memory and with at least one communication unit that enables the exchange of data and information, directly or indirectly, through the communication link with other entities, devices and networks. The communication unit may provide wired and/or wireless communication capabilities in accordance with one or more communication protocols, and therefore it may comprise the proper transmitter/receiver antennas, circuitry and ports, as well as the encoding/decoding capabilities that may be necessary for proper transmission and/or reception of data and other information. For example, the processor may be configured to receive electrical signals or information from the disclosed sensors (e.g., CMOS sensors), and to process the received information to produce images or other information of interest.

Various information and data processing operations described herein may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media that is described in the present application comprises non-transitory storage media. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes Only a few implementations and examples are described and other implementations, enhancements and variations can be made based on what is described and illustrated in this patent document.

What is claimed is:

1. An infrared photodetector, comprising:
   a substrate;
   a mesa disposed on the substrate, the mesa comprising:
      a layer of amorphous silicon disposed on a section of the substrate; and
      a layer of long wave infrared radiation (LWIR) absorbing material disposed on the layer of amorphous silicon;
   one or more passivation layers disposed on at least a part of sidewall of the mesa, wherein:
      the layer of LWIR absorbing material is operable to absorb infrared light in a range of wavelengths between 8 µm and 12 µm and produce a photocurrent, and
      the layer of amorphous silicon is operable to produce a carrier multiplication to amplify the photocurrent.

2. The photodetector of claim 1, wherein the substrate includes at least one of: a silicon, an indium tin oxide, a glass, a ceramic, a semiconductor, or a metal.

3. The photodetector of claim 1, wherein the layer of amorphous silicon is undoped or doped using a dopant.

4. The photodetector of claim 1, wherein the long wave infrared radiation (LWIR) absorbing material is one of: an amorphous germanium, a graphene, an amorphous GeSn, or a mercury cadmium telluride.

5. The photodetector of claim 1, wherein the layer of amorphous silicon is operable to produce the carrier multiplication via cycling excitation process.

6. The photodetector of claim 1, wherein the one or more passivation layers include a first layer of $Al_2O_3$ and a second layer of $SiO_2$ disposed on at least a part of the layer of $Al_2O_3$.

7. The photodetector of claim 1, comprising a first electrode disposed on the layer of LWIR absorbing material, a first contact pad configured to be in electric contact with the first electrode, and a second contact pad, wherein the first and the second contact pads are configured to receive an electric voltage to establish a difference of electrical potentials between the first and the second contact pads.

8. The photodetector of claim 1, wherein the first electrode and the first contact pad include at least one of chromium, gold, or titanium.

9. The photodetector of claim 1, wherein the first electrode provides at least 0.1% transmission through the first electrode for light with 10.6 μm wavelength.

10. The photodetector of claim 1, wherein a thickness of the layer of amorphous silicon is between 10 nm and 50 nm, wherein a thickness of the layer of LWIR absorbing material is between 50 nm and 200 nm, wherein a width of the mesa is between 10 μm and 1000 μm, or wherein a thickness of the first electrode is between 5 nm and 100 nm.

11. An uncooled long-wave infrared (LWIR) photodetector, comprising:
a first amorphous semiconductor material layer; and
a second amorphous semiconductor material layer in contact with the first amorphous semiconductor material layer,
wherein the first amorphous semiconductor material layer is configured to absorb infrared light and produce a photocurrent, and the second amorphous semiconductor material layer is configured to produce a carrier multiplication.

12. The uncooled long-wave infrared (LWIR) photodetector of claim 11, further comprising: a substrate having a portion in contact with the first amorphous semiconductor material layer and includes at least one of: a silicon, an indium tin oxide, a glass, a ceramic, a semiconductor, or a metal.

13. A method of manufacturing an infrared photodetector, comprising:
forming a multilayer structure, the forming comprising one of:
depositing a layer of amorphous silicon (a-Si) on at least a section of a substrate and
depositing a layer of long wave infrared radiation (LWIR) absorbing material next to the amorphous silicon; or
depositing a layer of long wave infrared radiation (LWIR) absorbing material on at least a section of a substrate and
depositing a layer of amorphous silicon (a-Si) next to the LWIR absorbing material;
depositing one or more passivation layers on at least a part of sidewall of the multilayer structure;
forming a first electrode in contact with one of: the layer of LWIR absorbing material, or the a-Si layer; and
forming a first contact pad in contact with the first electrode.

14. The method of claim 13, wherein the substrate includes at least one of: a silicon, an indium tin oxide, a glass, a ceramic, a semiconductor, or a metal.

15. The method of claim 13, wherein the long wave infrared radiation (LWIR) absorbing material is one of: an amorphous germanium, a graphene, an amorphous GeSn, or a mercury cadmium telluride.

16. The method of claim 13, wherein the one or more passivation layers include a first layer of $Al_2O_3$ and a second layer of $SiO_2$ disposed on at least a part of the layer of $Al_2O_3$.

17. The method of claim 16, wherein the depositing of the first layer of $Al_2O_3$ is performed using atomic layer deposition, wherein the depositing of the first layer of $Al_2O_3$ is performed at a temperature between 100° C. and 400° C., wherein the depositing of the second layer of $SiO_2$ is performed using plasma-enhanced chemical vapor deposition, or wherein the depositing of the second layer of $SiO_2$ is performed at a temperature between 100° C. and 400° C.

18. The method of claim 13, wherein the first electrode and the first contact pad include at least one of chromium, gold, or titanium.

19. The method of claim 13, wherein the depositing the layer of amorphous silicon is performed by plasma-enhanced chemical vapor deposition, wherein the depositing the layer of amorphous silicon is performed at a temperature between 100° C. and 400° C., wherein the depositing the layer of long wave infrared radiation (LWIR) absorbing material is performed using sputtering, or wherein the depositing the layer of long wave infrared radiation (LWIR) absorbing material is performed at a temperature between 0° C. and 100° C.

20. The method of claim 13, wherein the forming the multilayer structure is performed using photolithography and dry etching with $SF_6$:$C_4F_8$.

* * * * *